United States Patent
Radouane et al.

(10) Patent No.: US 8,461,055 B2
(45) Date of Patent: Jun. 11, 2013

(54) PROCESS FOR PREPARING CLEANED SURFACES OF STRAINED SILICON

(75) Inventors: Khalid Radouane, Carrieres sur Seine (FR); Alessandro Baldaro, Catania (IT)

(73) Assignee: Soitec, Bernin (FR)

(*) Notice: Subject to any disclaimer, the term of this patent is extended or adjusted under 35 U.S.C. 154(b) by 241 days.

(21) Appl. No.: 12/598,403

(22) PCT Filed: May 3, 2007

(86) PCT No.: PCT/IB2007/002570
§ 371 (c)(1),
(2), (4) Date: Feb. 25, 2010

(87) PCT Pub. No.: WO2008/135804
PCT Pub. Date: Nov. 13, 2008

(65) Prior Publication Data
US 2010/0140746 A1 Jun. 10, 2010

(51) Int. Cl.
*H01L 21/302* (2006.01)
*H01L 21/461* (2006.01)

(52) U.S. Cl.
USPC ............ 438/745; 438/752; 257/E21.223

(58) Field of Classification Search
USPC ................... 438/752; 257/E21.485
See application file for complete search history.

(56) References Cited

U.S. PATENT DOCUMENTS

| | | |
|---|---|---|
| 2004/0053477 A1 | 3/2004 | Ghyselen et al. |
| 2004/0222498 A1 | 11/2004 | Beintner et al. |
| 2006/0264008 A1* | 11/2006 | Delattre ............ 438/479 |

FOREIGN PATENT DOCUMENTS

| | | |
|---|---|---|
| JP | 2001257192 A | 9/2001 |
| JP | 2002158206 A | 5/2002 |
| WO | 2004006311 | 1/2004 |
| WO | 2007000537 | 1/2007 |

OTHER PUBLICATIONS

International Search Reported dated Apr. 17, 2008 for PCT/IB2007/002570.
Written Opinion dated Apr. 17, 2008 for PCT/IB2007/002570.
International Preliminary Report on Patentability dated Nov. 3, 2009 for PCT/IB2007/002570.
Ghyselen et al., Engineering Strained Silicon on Insulator Wafers with the Smart CutTM Technology, Solid-State Electronics, vol. 48 (2004) pp. 1285-1296.
Japanese Office Action for Japanese Application No. 2010-504877 dated Feb. 14, 2012, 8 pages.
Japanese Office Action for Japanese Application No. 2010-504877 dated May 29, 2012, 4 pages.

* cited by examiner

*Primary Examiner* — Daniel Whalen
(74) *Attorney, Agent, or Firm* — TraskBritt

(57) ABSTRACT

The present invention relates to a method of treating wafers comprising at least one surface layer of silicon-germanium (SiGe) and a layer of strained silicon (sSi) in contact with the SiGe layer, the sSi layer being exposed by etching of the SiGe layer, the method comprising the steps of:
(a) a first selective etch of the SiGe layer, optionally followed by an oxidative cleaning step;
(b) a rinsing step using deionized water;
(c) drying; and
(d) a second selective etch step.

The present invention relates to a wafer comprising at least one surface layer of strained silicon (sSi), the at least one surface layer of sSi having a thickness of at least 5 nm and at most 100 μm and having at most 200 defects per wafer.

16 Claims, 3 Drawing Sheets

PROCESS FOR PREPARING CLEANED SURFACES OF STRAINED SILICON

CROSS-REFERENCE TO RELATED APPLICATIONS

This application is the national stage entry of PCT International Patent Application Number PCT/IB2007/002570, filed on May 3, 2007, designating the United States of America and published in English as PCT International Publication Number WO 2008/135804 A1 on Nov. 13, 2008, which PCT International Application is incorporated herein in its entirety by this reference.

BACKGROUND OF THE INVENTION

1. Field of the Invention

Referring to FIG. 1, the present invention relates to cleaning layers of strained silicon (sSi) 10 denuded by selective etching of a layer of silicon-germanium (SiGe) 12 in contact with the sSi layer 10, as used in the fabrication of sSOI (strained silicon-on-insulator) or SGOI (silicon-germanium (SiGe)-on-insulator) type wafers.

2. State of the Art

A number of techniques exist for preparing such wafers. One example of one of the most effective current techniques for fabricating sSOI- or SGOI-type wafers is the production of an active layer of strained silicon (sSi) or relaxed SiGe by transfer thereof onto an insulating support (for example, a layer of $SiO_2$ 14 on a silicon substrate 16) using the SMART-CUT® technique to produce the desired heterostructure. Particular examples of implementations of such fabrication techniques are described in U.S. Patent Application Publication No. 2004/0053477 and International Patent Publication WO 2004/006311.

The finishing step of such wafers involves a selective etching procedure to eliminate the SiGe layer 12 subsisting above the silicon layer 10 after transfer thereof to the "receiver" substrate 16 and detachment from the "donor" substrate (not shown). Selective etching is a chemical attack method that can selectively eliminate the upper layer of SiGe 12 without attacking the next layer of strained silicon (sSi) 10. Compositions that have been found to be capable of achieving such a "selective etch" include $CH_3COOH/H_2O_2/HF$ mixtures.

After the selective etch step, which removes the upper layer of SiGe 12, a cleaning step may appropriately be used in order to reduce particulate contamination and surface defects on the surface 11 of the strained silicon layer following selective etching of the SiGe layer 12. The cleaning composition must thus be chosen so as to enable cleaning of the sSi surface 11 while avoiding etching of this strained silicon layer 10.

This post-selective etch cleaning step generally uses compositions containing oxidants, but not containing hydrofluoric acid (HF). A known method, termed "RCA," comprises: a first step of cleaning using an "SC1" (Standard Clean 1) solution (or APM, ammonium hydroxide peroxide mixture) containing $NH_4OH$, $H_2O_2$, and deionized water, and a second cleaning step using an "SC2" (Standard Clean 2) solution (or HPM, hydrochloric peroxide mixture) containing HCl, $H_2O_2$, and deionized water.

An alternative treatment method, proposed in U.S. Patent Application Publication No. 2006/0264008, comprises a step of cleaning the surface 11 of the strained silicon layer 10 with an aqueous ozone solution, rather than using the RCA cleaning procedure, following the step of selective etching of the SiGe layer 12.

The wafer obtained by the process steps of 1) selective etching of the SiGe layer 12, and 2) oxidative cleaning, may then be used in subsequent semiconductor device manufacturing processes. Generally, the oxidative cleaning step is followed by a step of rinsing with deionized water.

The wafer with an exposed sSi 10 thus obtained may be used in MOS transistors. Workers in the semiconductor industry are in effect constantly engaged in an effort to reduce the dimensions and increase the speed of operation of integrated circuits. Other parameters being equal, the operation speed of a transistor is increased by increasing the mobility of charge carriers, both electrons and (positive) holes, and one way of achieving this is by the use of strained silicon 10, wherein silicon, grown on a silicon-germanium surface, is obliged to have more broadly spaced atoms than in pure silicon. A doubling of charge carrier mobility with respect to normal, relaxed silicon can be observed.

Concerning the existing technology in this area, the present inventors have found that the degree of defects as measured by SOD (sum of defects) remains higher than is desirable for the applications envisaged for the wafers obtained.

In addition, the present inventors have observed that the SiGe 12 is not completely removed by prior art processes. Instead, although SiGe 12 is completely removed in certain areas, other zones, or "islands," of SiGe 12 persist. It has been observed that these islands may correspond to about 35% of the surface defects measured. Germanium atoms from such islands may diffuse into and contaminate the strained silicon layer 10. Further, these islands may disturb subsequent fabrication steps, e.g. doping steps.

There therefore remains a need in the art to produce sSi layers 10 showing a minimum amount of surface defects and a minimum amount of residual SiGe 12. Any further cleaning processes other than prior art processes of 1) selective etching of the SiGe layer 12, and 2) oxidative cleaning, need, however, to be chosen so as to minimize consumption of now exposed parts of the sSi layer 10.

BRIEF SUMMARY OF THE INVENTION

The present inventors have now surprisingly found that it is possible to achieve lower surface defects and reduced residual SiGe by a process comprising a second selective etch step, such that rinsing and drying steps are inserted between a first and a second selective etch steps.

The present invention is thus directed in a first aspect to a method of treating wafers comprising at least one surface layer of silicon-germanium (SiGe) and a layer of strained silicon (sSi) in contact with the SiGe layer, the sSi layer being exposed by etching of the SiGe layer, the method comprising the steps of:

(a) a first selective etch of the SiGe layer, optionally followed by an oxidative cleaning step;
(b) a rinsing step using deionized water;
(c) drying; and
(d) a second selective etch step.

The present invention is also directed in a second aspect to a wafer that can in particular be obtained by the method of the present invention.

DETAILED DESCRIPTION OF THE INVENTION

In one embodiment, in the method according to the present invention, the first selective etch step (a) 100 (FIG. 1) is carried out with an etching solution comprising a mixture of acetic acid ($CH_3COOH$), hydrogen peroxide ($H_2O_2$) and hydrofluoric acid (HF). Generally appropriate process conditions for use with such a selective etch solution during first selective etch step (a) 100 comprise a concentration of hydrofluoric acid (HF) of at least 0.05% and at most 10% by weight, and about 2% (1.5% to 2.5%) in a currently preferred embodiment.

In a first currently preferred embodiment, an acetic acid/$H_2O_2$/HF mixture is used in proportions of 15/15/1 by volume, corresponding to 49%:49%:2% by weight. In a second currently preferred embodiment, an acetic acid/$H_2O_2$/HF mixture is used in proportions of 1/1/1 by volume, corresponding to 32 wt %:50 wt %:18 wt %.

A generally appropriate temperature during the first selective etch step (a) 100 is at least 20° C. and at most 60° C., and a generally appropriate duration of the first selective etch step (a) 100 is at least 20 seconds and at most 500 seconds. In addition, a wafer rotation rate in the range of 400 rpm to 2000 rpm may be appropriately used.

Figure 1:
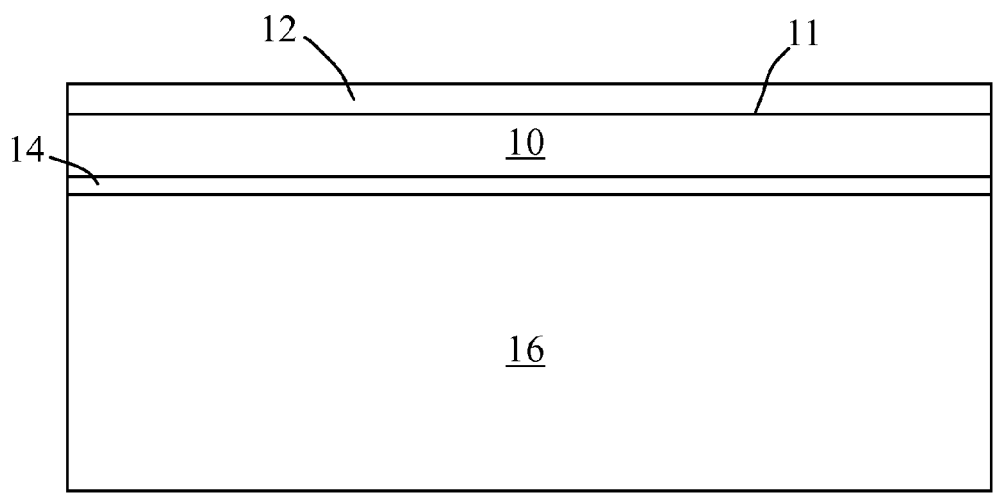
FIG. 1 is a simplified side view of a wafer that includes a layer of strained semiconductor material on a bulk substrate with an insulator between the bulk substrate and the layer of strained semiconductor material, wherein a surface layer to be removed is present on the layer of strained semiconductor material.

In an alternative embodiment according to the present invention, the first selective etch step (a) 100 is carried out using RCA solutions: first an SC1 solution and then an SC2 solution. The present inventors have in effect observed that RCA solutions here may be used for selective etching as well as for oxidative cleaning. This procedure can also be applied for the second selective etch step (d) 110 (FIG. 1).

In a further alternative embodiment, a mixture of acetic acid/$H_2O_2$/HF/$H_2SO_4$, in relative proportions of 15/15/1/5 by volume, can be used for the first selective etch step (a) 100. Such a mixture can also be used for the second selective etch step (d) 110.

In one embodiment, in the method according to the present invention, the first selective etch step (a) 100 is continued beyond the point at which measurement shows, or theoretical calculations by extrapolation predict, that SiGe 12 (FIG. 1) has been completely removed from (at least some regions of) the now exposed sSi surface 11. This phase is referred to as "over-etch" (OE) 102, but does not represent a distinct process step in the sense that the reagents used are the same as in the first selective etch step (a) 100. The over-etch 102 is a continuation beyond the moment of end-point detection (EPD) corresponding to SiGe 12 removal. A reflectometer measuring the intensity of reflected light may be used to detect the endpoint. Alternatively, if the ability of a given selective etch solution at a certain temperature to remove SiGe 12 (FIG. 1), as a thickness removed as a function of time, has been precisely determined by previous experiments, the endpoint of the first selective etch step (a) 100, which is the instant in time at which the over-etch 102 starts, can be calculated with a reasonable degree of certainty. An over-etch 102, which is optional in the present invention, may help to reduce possible inhomogeneity arising from etching. The duration of the over-etch 102 is generally appropriately selected in the range of 0 seconds to at most 60 seconds.

In one embodiment, in the method according to the present invention, an oxidative cleaning step 104 is carried out after the first selective etch step (a) 100, this oxidative cleaning step 104 using a solution of ozone ($O_3$) dissolved in water in a concentration in the range of 15 ppm to 50 ppm, at a temperature of 17° C. to 35° C., for a period of 5 s to 300 s. A currently preferred treatment time for this oxidative cleaning step 104 is about 15 seconds. An appropriate wafer rotation rate for this treatment with ozone lies in the range of 400 rpm to 2000 rpm.

In the case where an oxidative cleaning step 104 is indeed carried out after the first selective etch step (a) 100, for example using ozone, it is believed, though this should not be construed as limiting the invention, that the second selective etch step (d) 110 not only removes residual "islands" of SiGe 12, but may also remove possible oxides of Si and Ge present on the sSi surface 11 (FIG. 1).

In the framework of the method according to the present invention, the deionized water (DIW) used in rinsing step (b) 106 is of standard quality for use in microelectronics. A generally appropriate duration of the rinsing step (b) 106 is of at least 5 s and at most 3 minutes. A currently preferred treatment time for this DIW rinsing step (b) 106 is about 15 seconds, at a temperature of 15° C. to 60° C. A generally appropriate wafer rotation rate for rinsing step (b) 106 is at least 400 rpm and at most 2000 rpm.

In one embodiment, in the method according to the present invention, the drying of step (c) 108 is carried out using a flow of inert gas, such as nitrogen or argon. The purity and pressure conditions of the gas used are appropriately chosen to have the usual parameters used by skilled practitioners in microelectronics. In an appropriate embodiment, nitrogen gas is supplied using a nozzle designed for drying the wafer after rinsing. A currently preferred drying process involves drying the wafer being treated in two scans (passes) using nitrogen gas.

In one embodiment, in the method according to the present invention, the second selective etch step (d) 110 is carried out with an etching solution comprising a mixture of acetic acid ($CH_3COOH$), hydrogen peroxide ($H_2O_2$) and hydrofluoric acid (HF). A generally appropriate concentration of hydrofluoric acid (HF) during the second selective etch step (d) 110 is at least 0.05% and at most 10% by weight. A generally appropriate temperature during the second selective etch step (d) 110 is at least 20° C. and at most 60° C.

Concerning the duration of the second selective etch step (d) 110, the preferred maximum duration is about 40 seconds. A currently preferred range, notably in the context of an etching solution comprising a mixture of acetic acid ($CH_3COOH$), hydrogen peroxide ($H_2O_2$) and hydrofluoric acid (HF), is from at least 5 seconds to at most 40 seconds. A further currently preferred duration of the second selective etch step (d) 110 in this context is of at least 10 seconds and at most 30 seconds, or more preferably of at least 15 seconds and at most 25 seconds, and a duration of about 20 seconds has been found to particularly appropriate.

In one embodiment, in the method according to the present invention, the second selective etch step (d) 110 may be directly followed by a rinsing step 114 and then a drying step 116. Generally appropriate process conditions are those described above for the rinsing step (b) 106 and the drying step (c) 108 that follow the first selective etch step (a) 100.

In one embodiment, in the method according to the present invention, the second selective etch step (d) 110 is followed by a further oxidative cleaning step (e) 112. One appropriate process choice for this further oxidative cleaning step (e) 112 comprises the use of a solution of ozone ($O_3$) dissolved in water in a concentration of at least 15 ppm and at most 50 ppm, at a temperature of at least 17° C. and at most 35° C., for a period of at least 5 s and at most 300 s.

In the case where a second oxidative cleaning step (e) 112 is indeed carried out after the second selective etch step (d) 110, for example using ozone, it is believed, though this should not be construed as limiting the invention, that the second oxidative cleaning step (e) 112 may make the final surface 11 more hydrophilic through surface oxidation and by this means inhibit contamination by particle deposition.

In one embodiment, in the method according to the present invention, the further oxidative cleaning step (e) 112 may be followed by a rinsing step 114 and a drying step 116. Generally appropriate process conditions are those described above for the rinsing step (b) 106 and the drying step (c) 108 that follow the first selective etch step (a) 100.

Figure 3:
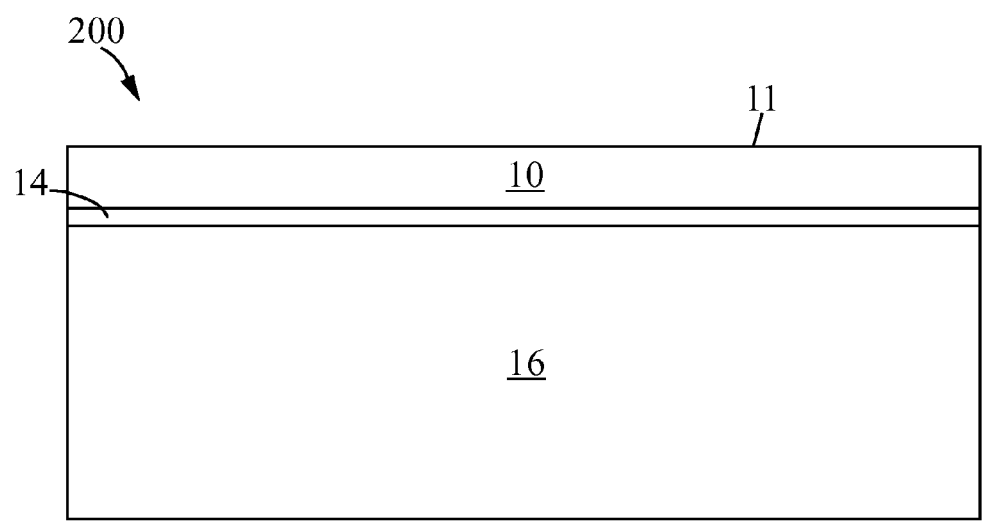
FIG. 3 illustrates a wafer according to embodiments of the present disclosure from which a surface layer has been removed from a layer of strained semiconductor material as described herein.

Referring to FIG. 3, the present invention is also directed in a second aspect to a wafer 200 that can in particular be obtained by the method of the present invention.

A wafer 200 according to the present invention preferably comprises at least one surface layer of strained silicon (sSi) 10, said surface layer of sSi 10 having a thickness of at least 5 nanometers and at most 100 nanometers, preferably between 10 nanometers and 30 nanometers, and preferably shows a sum of defects (SOD) value SOD @ 0.40 μm of at most 200 defects per wafer 200.

The SOD here is determined as described in U.S. Patent Application Publication No. 2006/0264008 with a detection threshold of 0.40 μm. The measurements can be made, for example, with an SPI apparatus, available from KLA-Tencor Corporation, Milpitas, Calif. The measurement comprises the detection of LPD (small defects) and AP (larger defects). These different groups of defects, distinguished by size, both include topological defects (holes, craters or bumps) as well as particles (dust). SOD is a sum of LPD and AP. It is possible to discern the qualitative kind of the defects by scanning electron microscope measurement, where it has been detected by the present inventors that 95% of the remaining defects (after the second etching step) are topological defects of the surface and 5% are due to particles.

Figure 2:
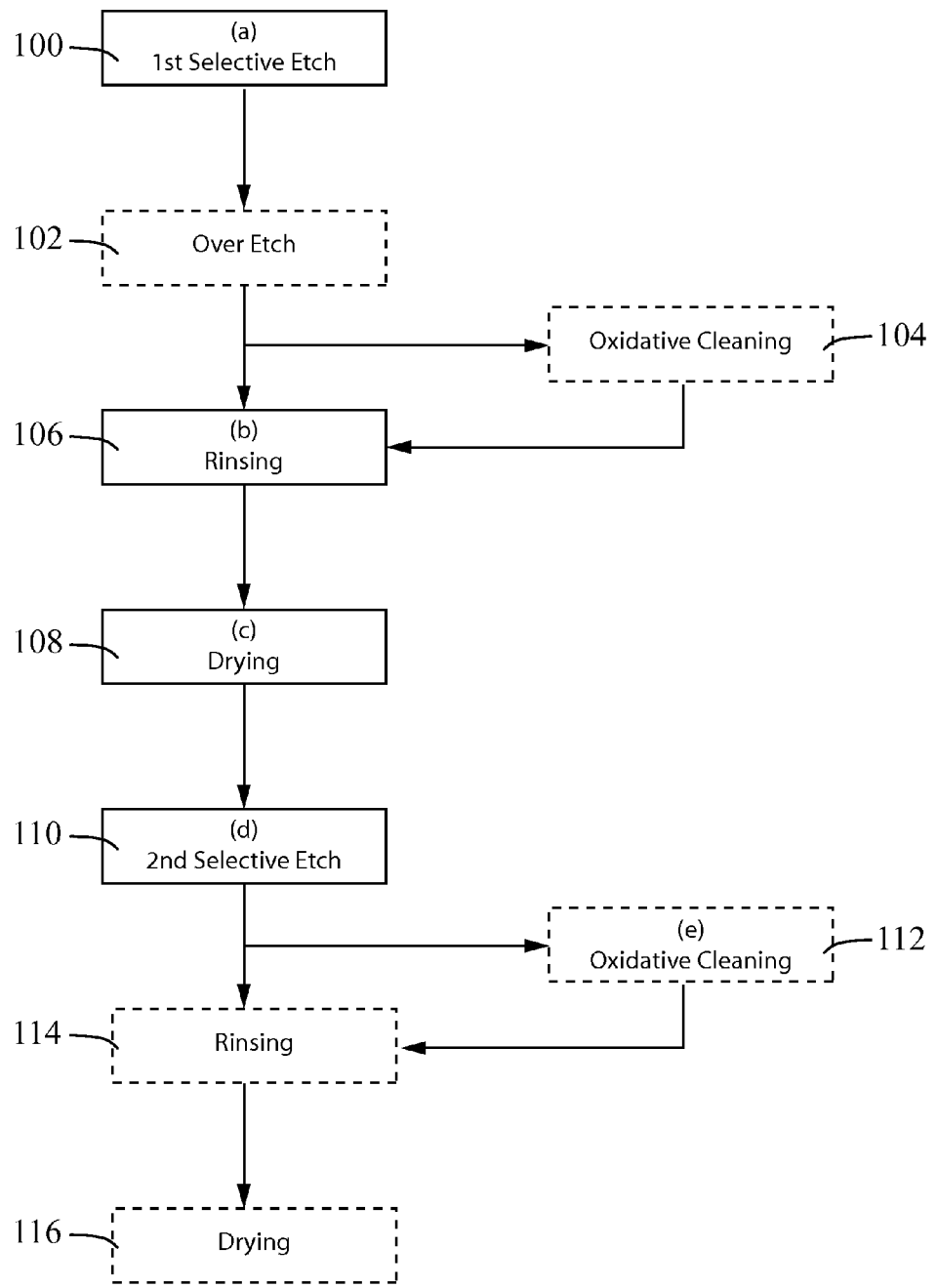
FIG. 2 is a diagram used to illustrate embodiments of methods of the present disclosure for removing a surface layer from a layer of strained semiconductor material.

The SOD values observed for wafers 200 according to the present invention represent a considerable improvement over those observed for prior art wafers. Namely, the present inventors have observed that typical values of SOD @ 0.40 μm after the first, and, in the conventional art methods, the only selective etch step (a) 100 (FIG. 2), are in the region of 4000 defects per wafer. A reduction of SOD values by a factor of about 15 or 20 times is thus made possible by the present invention.

In a preferred embodiment, wafers 200 according to the present invention have a diameter of about 200 millimeters or about 300 millimeters. In effect, wafers in the microelectronics field are produced in these standard sizes. The preferred maximum of 200 defects per wafer is appropriate for both 200 mm and 300 mm wafers.

Wafers 200 according to the present invention generally show a surface roughness of at most 1 Å rms for a scanning surface of 2 μm×2 μm. In appropriate embodiments, the defect density is less than 0.3 particles/$cm^2$ for a 300 mm wafer 200 (a consequence of the 200 defects limit) and 0.6 particles/$cm^2$ for the 200 mm wafer 200.

Wafers 200 according to the present invention generally have a strained silicon-on-insulator (sSOI) structure. The wafers 200 are preferentially obtained by the SMARTCUT® technology, as previously mentioned, whereby the stacking of sSi/SiGe is transferred from a donor substrate to a receptor Si bulk substrate 16 by means of an oxide layer 14.

EXAMPLES

The following table indicates treatment conditions that were tested in the framework of the present invention. The treated wafers were obtained by the SMARTCUT® technique for fabricating sSOI- or SGOI-type wafers, as described, for example, in U.S. Patent Application Publication No. 2004/0053477. Wafers used were silicon bulk wafers for microelectronics use, available on the market as "silicon of microelectronic quality," with diameters of 200 mm or 300 mm, which today are the two standard sizes.

| Step | Process details | Example 1 | Ex. 2 | Ex. 3 | Comparative Ex. 1 |
|---|---|---|---|---|---|
| | Wafer diameter/mm | 300 | 200 | 300 | 300 |
| (a) First selective etch | Reagent identities and concentrations: | Acetic Acid/ $H_2O_2$/HF: (15/15/1 by volume, i.e. 49%: 49%: 2% by weight) | (As Ex. 1) | Acetic Acid/ $H_2O_2$/HF: 1/1/1 by vol. = 32:50:18% by wt. | (As Ex. 1) |
| | Temperature: | 25° C. | 25° C. | 30° C. | 26° C. |
| | Time: | 300 s | 260 s | 500 s | 260 s |
| Over etch | Time: | 30 s | 30 s | 30 s | 30 s |
| Oxidative cleaning step | Reagent identities and concentrations: | $O_3$ 25 ppm in DIW | (As Ex. 1) | (As Ex. 1) | (As Ex. 1) |
| | Temperature: | 17° C. | 25° C. | 30° C. | (As Ex. 1) |
| | Time: | 20 s | 25 s | 100 s | (As Ex. 1) |
| (b) Rinsing using deionized water (DIW) | Temperature: Time: | 25° C. 10 s | 20° C. 20 s | 50° C. 100 s | 20° C. 10 s |
| (c) Drying | Drying gas | $N_2$ | $N_2$ | $N_2$ | — |
| | Wafer rotation speed | 1500 rpm | 1600 rpm | 2000 rpm | — |
| | Flow rate | 20 litre/min | 20 litre/min | 20 litre/min | — |
| | Number of passes | 2 | 2 | 2 | — |

-continued

| Step | Process details | Example 1 | Ex. 2 | Ex. 3 | Comparative Ex. 1 |
|---|---|---|---|---|---|
| (d) Second selective etch | Reagent identities and concentrations: | Acetic Acid/ $H_2O_2$/HF: (15/15/1 by volume) | (As Ex. 1) | Acetic Acid/ $H_2O_2$/HF: 1/1/1 by vol.) | (As Ex. 1) |
| | Temperature: | 25° C. | 25° C. | 30° C. | 26° C. |
| | Time: | 20 s | 10 s | 25 s | 10 s |
| (e) Post-second selective etch further oxidative cleaning step | Reagent identities and concentrations: Temperature: Time: | Same as first oxidative cleaning step in Ex. 1 above, before step (b) | Same as first oxidative cleaning step in Ex. 2 | Same as first oxidative cleaning step in Ex. 3 | $O_3$ 25 ppm in DIW 20° C. 20° C. |
| Post-second selective etch rinsing using DIW | Temperature: Time: | 25° C. 20 s | 20° C. 30 s | 50° C. 110 s | 20° C. 10 s |
| Post-second selective etch drying | Drying gas Wafer rotation speed Flow rate Number of passes | Same conditions as in first drying step (c) in Ex. 1 above | Same conditions as in first drying step (c) in Ex. 2 above | Same conditions as in first drying step (c) in Ex. 3 above | $N_2$ 1000 rpm 20 litre/min 2 |
| Results | SOD values | 150 | 200 | 250 | 3500 |

The invention claimed is:

1. A method of treating at least one wafer comprising at least one silicon-germanium (SiGe) layer and a strained silicon (sSi) layer in contact with the at least one SiGe layer, the sSi layer being exposed by etching of the at least one SiGe layer, the method comprising:
   selectively etching the at least one SiGe layer in a first selective etch process and at least substantially removing the at least one SiGe layer;
   rinsing at least a portion of the at least one wafer using deionized water after the first selective etch process;
   drying the at least a portion of the at least one wafer; and
   selectively etching any remaining SiGe of the at least one SiGe layer in a second selective etch process after the rinsing and the drying of the at least a portion of the at least one wafer.

2. The method of claim 1, wherein selectively etching the at least one SiGe layer in a first selective etch process comprises selectively etching the at least one SiGe layer with an etching solution comprising a mixture of acetic acid ($CH_3COOH$), hydrogen peroxide ($H_2O_2$) and hydrofluoric acid (HF).

3. The method of claim 2, wherein a concentration of hydrofluoric acid (HF) in the etching solution is at least 0.05% and at most 10% by weight, a temperature during the first selective etch process is at least 20° C. and at most 60° C., and a duration of the first selective etch process is at least 20 seconds and at most 500 seconds.

4. The method of claim 1, wherein selectively etching the at least one SiGe layer in a first selective etch process further comprises cleaning at least a portion of the at least one wafer in an oxidative cleaning process after the first selective etch process using a solution of ozone ($O_3$) dissolved in water in a concentration of at least 15 ppm and at most 50 ppm, at a temperature of at least 17° C. and at most 35° C., for a period of at least 5 seconds and at most 300 seconds.

5. The method of claim 4, wherein rinsing at least a portion of the at least one wafer using deionized water further comprises rinsing the at least a portion of the wafer with the deionised water for a duration of at least 5 seconds and at most 3 minutes, at a temperature of 15° C. to 60° C.

6. The method of claim 1, wherein rinsing at least a portion of the at least one wafer using deionized water further comprises rinsing the at least a portion of the wafer with the deionized water for a duration of at least 5 seconds and at most 3 minutes, at a temperature of 15° C. to 60° C.

7. The method of claim 1, wherein drying the at least a portion of the at least one wafer further comprises drying the at least a portion of the at least one wafer using a flow of inert gas.

8. The method of claim 1, wherein selectively etching any remaining SiGe of the at least one SiGe layer in a second selective etch process further comprises selectively etching any remaining SiGe of the at least one SiGe layer with an etching solution comprising a mixture of acetic acid ($CH_3COOH$), hydrogen peroxide ($H_2O_2$) and hydrofluoric acid (HF).

9. The method of claim 8, wherein a concentration of hydrofluoric acid (HF) in the etching solution is at least 0.05% and at most 10% by weight, a temperature during the second selective etch process is at least 20° C. and at most 60° C., and a duration of the second selective etch process is at least 5 seconds and at most 40 seconds.

10. The method of claim 8, wherein a duration of the second selective etch process is at least 10 seconds and at most 30 seconds.

11. The method of claim 10, wherein the duration of the second selective etch process is at least 15 seconds and at most 25 seconds.

12. The method of claim 11, wherein the duration of the second selective etch process is about 20 seconds.

13. The method of claim 1, further comprising performing another rinsing process after the second selective etch process, and performing another drying process after the another rinsing process.

14. The method of claim 1, further comprising cleaning at least a portion of the at least one wafer in an oxidative cleaning process after the second selective etch process.

15. The method of claim 14, wherein the oxidative cleaning process comprises cleaning the at least a portion of the at least one wafer using a solution of ozone ($O_3$) dissolved in water at a concentration of at least 15 ppm and at most 50 ppm, at a temperature of at least 17° C. and at most 35° C., for a period of at least 5 seconds and at most 300 seconds.

16. The method of claim 14, further comprising performing another rinsing process after the oxidation cleaning process, and performing another drying process after the another rinsing process.

* * * * *